United States Patent
Kupers et al.

(10) Patent No.: US 10,281,825 B2
(45) Date of Patent: May 7, 2019

(54) METHOD OF SEQUENCING LOTS FOR A LITHOGRAPHIC APPARATUS

(71) Applicant: ASML NETHERLANDS B.V., Veldhoven (NL)

(72) Inventors: Michiel Kupers, Roermond (NL); Wolfgang Helmut Henke, Kempen (DE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/084,586

(22) PCT Filed: May 5, 2017

(86) PCT No.: PCT/EP2017/060749
§ 371 (c)(1),
(2) Date: Sep. 13, 2018

(87) PCT Pub. No.: WO2017/198478
PCT Pub. Date: Nov. 23, 2017

(65) Prior Publication Data
US 2019/0072857 A1    Mar. 7, 2019

(30) Foreign Application Priority Data
May 19, 2016   (EP) .................................... 16170348

(51) Int. Cl.
*G03B 27/68* (2006.01)
*G03F 7/20* (2006.01)

(52) U.S. Cl.
CPC .......... *G03F 7/70525* (2013.01); *G03F 7/705* (2013.01); *G03F 7/70858* (2013.01); *G03F 7/70891* (2013.01)

(58) Field of Classification Search
CPC .. G03F 7/705; G03F 7/70525; G03F 7/70891; G03F 7/70875; G03F 7/70483;
(Continued)

(56) References Cited

U.S. PATENT DOCUMENTS

2002/0100013 A1 * 7/2002 Miwa ...................... G03F 7/705
700/121
2005/0018163 A1 1/2005 Jeunink et al.
(Continued)

FOREIGN PATENT DOCUMENTS

JP    2011060882    3/2011

OTHER PUBLICATIONS

Taiwanese Office Action issued in corresponding Taiwanese Patent Application No. 106116225, dated Mar. 15, 2018.
International Search Report and Written Opinion issued in corresponding PCT Patent Application No. PCT/EP2017/060749, dated Jul. 21, 2017.

*Primary Examiner* — Christina A Riddle
(74) *Attorney, Agent, or Firm* — Pillsbury Winthrop Shaw Pittman LLP

(57) ABSTRACT

A lithographic apparatus applies patterns to substrates, the substrates being processed as a plurality of lots. Each lot of substrates receives a particular layer pattern under layer-specific operating conditions. A thermal model is provided for modeling and compensating one or more characteristics of thermal behavior of components within the lithographic apparatus, in response to the varying layer-specific operating conditions associated with a sequence of lots. The thermal model is also used to simulate thermal behavior of the apparatus when processing a given collection of lots in different possible sequences. Based on comparison of the simulated thermal behavior in different sequences of lots, an optimized sequence is determined. Optionally, lot sequenc-
(Continued)

ing rules are determined and used to obtain a preferred thermal behavior when processing a collection of lots in the future.

20 Claims, 7 Drawing Sheets

(58) Field of Classification Search
CPC .............. G03F 7/70491; G03F 7/70533; G03F 7/70541; G03F 7/70858; G03F 7/70866; G03F 7/70883; G06Q 50/04; G06Q 10/06; G06Q 10/0631; G06Q 10/06313; G06Q 10/06316; G06Q 10/0639; G06Q 10/06395
USPC ............... 355/30, 46, 52, 53, 55, 67, 72–77; 250/492.1, 492.2, 492.22, 548; 414/935, 414/940; 700/121, 95, 99–103, 108, 109, 700/29–31, 32, 33, 299–300
See application file for complete search history.

(56) References Cited

U.S. PATENT DOCUMENTS

| | | |
|---|---|---|
| 2005/0256600 A1 | 11/2005 | Nakasugi |
| 2006/0114437 A1* | 6/2006 | Akhssay ............. G03F 7/70258 355/55 |
| 2006/0149404 A1* | 7/2006 | Denton ............ G05B 19/41865 700/99 |
| 2007/0004052 A1* | 1/2007 | Wada .................. G03F 7/70991 438/5 |
| 2010/0171939 A1* | 7/2010 | Baselmans .............. G03F 7/705 355/30 |
| 2011/0063593 A1* | 3/2011 | Kanda .................... G03B 27/42 355/53 |
| 2013/0235361 A1* | 9/2013 | Baselmans .......... G03F 7/70141 355/67 |
| 2014/0272717 A1 | 9/2014 | Cheng et al. |

\* cited by examiner

METHOD OF SEQUENCING LOTS FOR A LITHOGRAPHIC APPARATUS

CROSS-REFERENCE TO RELATED APPLICATIONS

This application is the U.S. national phase entry of PCT patent application no. PCT/EP2017/060749, which was filed on May 5, 2017, which claims the benefit of priority of European patent application no. 16170348.3, which was filed on May 19, 2016, and which is incorporated herein in its entirety by reference.

BACKGROUND

Field of the Invention

The present invention relates to methods and control apparatus usable, for example, in the manufacture of devices by patterning processes such as lithography. The invention further relates to methods of manufacturing devices using lithographic techniques. The invention yet further relates to computer program products for use in implementing such methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (also referred to as a "field" e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In a high volume manufacturing environment, many batches or "lots" of substrates may be processed through the lithographic apparatus in the course of an hour or a day. Each lot comprises wafers of a particular product, and the apparatus applies a pattern appropriate for a particular layer in that product under layer-specific operating conditions. On the other hand, the lots processed in the day or in an hour may comprise a diverse mixture of different product and/or layer types. In order to achieve optimal performance of the lithographic process in each device, very accurate control of the imaging process, both in terms of positioning the patterns and creating the patterns in a resist layer, is required. In modern products, extremely tight specifications for performance parameters such as overlay and critical dimension (CD) are established, and each new generation of product requires ever tighter specifications. During processing of the substrates, many measurements and corrections are made to achieve the required performance. Many of these corrections are specific to a particular layer. On the other hand, all the lots and substrates within the lots are subject to errors caused by thermal behaviors within the substrate and within other components of the lithographic apparatus.

Although thermal models have been established which attempt to model and compensate for thermally-induced distortions, the distortions experienced by different substrates within different lots are not the same, even for the same layer type and for the same operating conditions. One reason for this is that heating effects build and dissipate within components of the apparatus, within the patterning device, and within the substrate and the substrate support, over timescales that are longer than the processing of an individual wafer, or even an individual lot. Consequently, in an environment where a diverse range of different lot types are being processed through the same lithographic apparatus, thermal effects are simply too unpredictable to be corrected by known techniques. Although it is recognized that performance in one lot can be influenced by thermal characteristics lingering from the processing of previous lots, the systematic approach to sequencing a collection of lots to minimize such errors has been seen before now.

SUMMARY OF THE INVENTION

The present invention aims to enable improved performance to be obtained in a lithographic manufacturing facility, by more optimal sequencing of lots.

According to a first aspect of the present invention, there is provided a method of determining a lot processing sequence for a lithographic apparatus, the lithographic apparatus being configured to apply patterns to a number of product substrates to define various layers of one or more products, wherein the method includes:

(a) using a thermal model to simulate thermal behavior of one or more components within the lithographic apparatus in response to layer-specific operating conditions associated with each lot when processing a given collection of lots in two or more different processing sequences; and (b) based on comparison of the simulated thermal behavior in different sequences of lots, determining a sequence for processing a collection of lots to obtain a preferred thermal behavior.

The invention may be applied to improve performance in one or more respects, when substrates are processed in a plurality of lots, the substrates within each lot receiving a particular layer pattern under layer-specific operating conditions, while the substrates in other lots receive different layer patterns under different layer-specific operating conditions.

In some embodiments of the invention, a sequence for processing a given collection of lots is determined directly in step (b). In other embodiments, step (b) includes determining one or more lot sequencing rules for use in obtaining said preferred thermal behavior when processing a collection of lots in future. The lot sequencing rules are then used to determine a sequence of processing for a given collection of lots. Both types of embodiment can be combined in a single implementation, if desired.

The invention further provides a control system for a lithographic apparatus, the control system comprising:
  storage arranged to receive information defining a collection of lots to be processed;
  storage arranged to receive a set of one or more lot sequencing rules obtained by a method according to the invention as set forth above; and
  a controller for using the lot sequencing rules to determine a processing sequence for the defined collection of lots, and to control the lithographic apparatus to process the lots in the determined preferred sequence.

The various storage, controllers and processors of the control system are identified by their functions in the above summary, and two or more of these functions may be implemented using common hardware. They may in particular be implemented by programming one or more processors and controllers already present within a lithographic apparatus, an advanced process control system and/or a metrology system.

The invention yet further provides a method of manufacturing devices wherein substrates are processed in a plurality of lots, the substrates within each lot receiving a particular layer pattern under layer-specific operating conditions while the substrates in other lots receive different layer patterns under different layer-specific operating conditions, thereby to define various layers of one or more products, wherein a collection of lots are processed in a sequence determined by a method according to the invention as set forth above.

The invention yet further provides a lithographic apparatus including a control system according to the invention as set forth above.

The invention yet further provides a computer program product containing one or more sequences of machine-readable instructions for implementing a method according to the invention as set forth above.

These and other aspects and advantages of the apparatus and methods disclosed herein will be appreciated from a consideration of the following description and drawings of exemplary embodiments.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
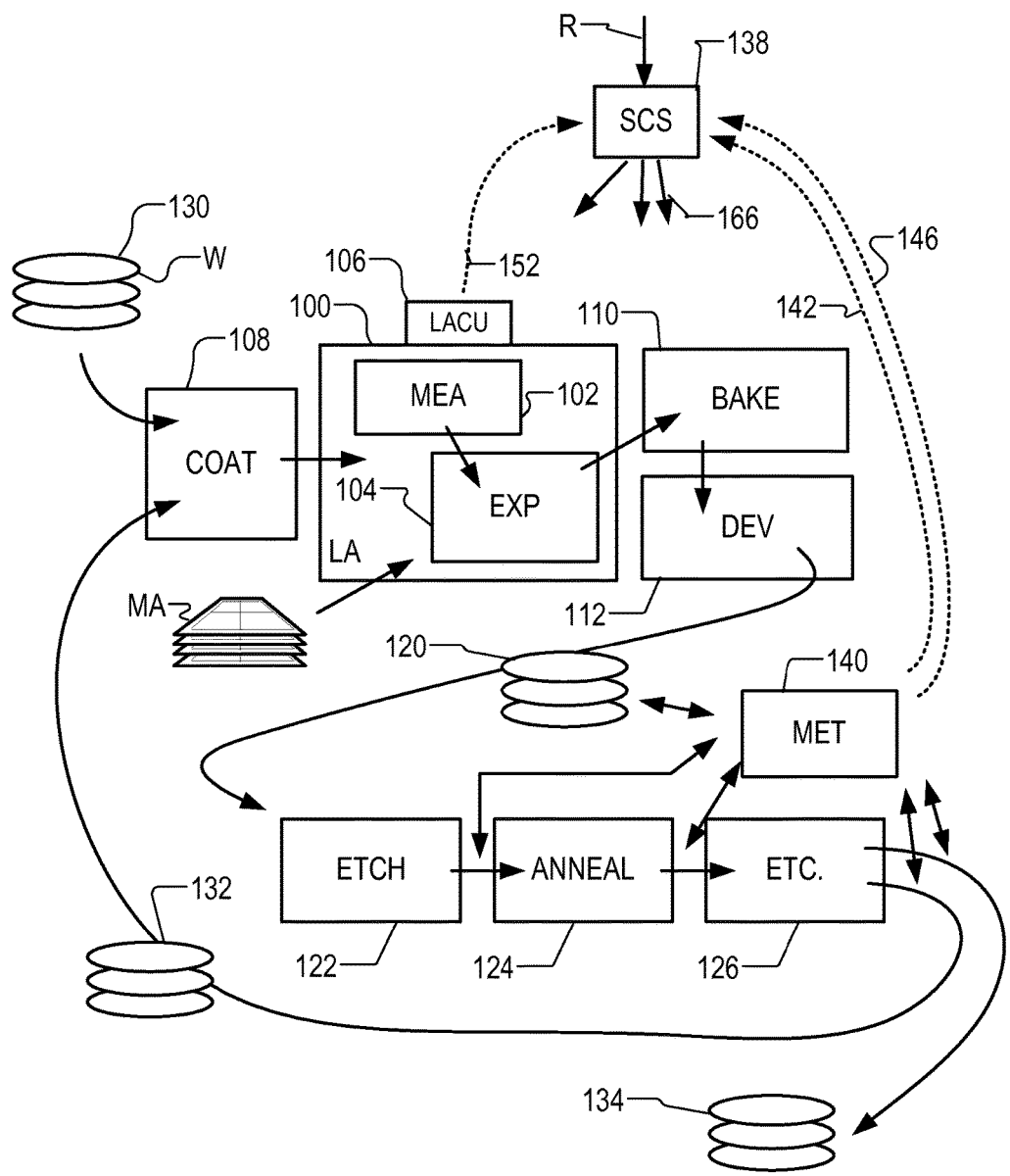
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by advanced process control system APC and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130. More than one type of metrology apparatus can be provided.

Alignment Process Background

Figure 2:
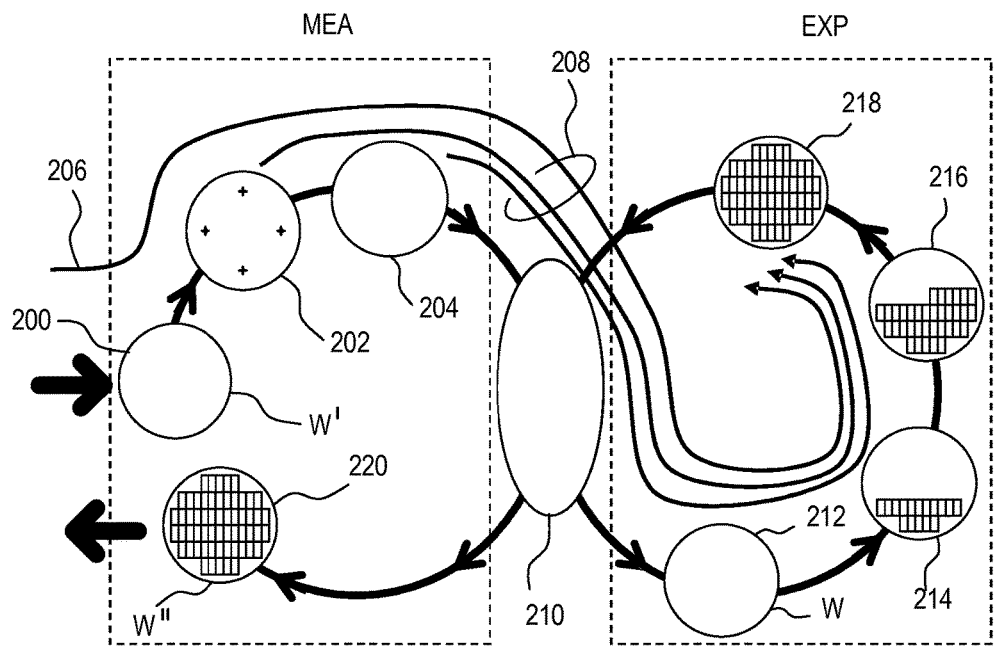
FIG. 2 illustrates schematically measurement and exposure processes in the apparatus of FIG. 1, according to known practice.

FIG. 2 illustrates the steps to expose target portions (e.g. dies) on a substrate W in the dual stage apparatus of FIG. 1. The process according to conventional practice will be described first. The present disclosure is by no means limited to dual stage apparatus of the illustrated type. The skilled person will recognize that similar operations are performed in other types of lithographic apparatus, for example those having a single substrate stage and a docking metrology stage.

On the left hand side within a dotted box are steps performed at measurement station MEA, while the right hand side shows steps performed at exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. Each patterning step can introduce positional deviations in the applied pattern, while subsequent processing steps progressively introduce distortions in the substrate and/or the pattern applied to it, that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation. Some layers may be patterned by steps that are alternative or supplementary to exposure in the illustrated lithographic apparatus. Such alternative and supplementary techniques include for example imprint lithography, self-aligned multiple patterning and directed self-assembly. The manufacturing facility illustrated in FIG. 1 can be extended to include a variety of lithographic apparatuses LA, accordingly.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a substrate model (sometimes referred to as the "wafer grid"), which maps very accurately the distribution of marks across the substrate, including any distortion relative to a nominal rectangular grid.

At step 204, a map of wafer height (Z) against X-Y position is measured also using the level sensor LS. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced alignment models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Advanced Process Control (APC) Background

For best performance, historical performance data relating to the lithography process are generally used in addition to measurements made when a current substrate is loaded into the lithographic apparatus. For this purpose, measurements of performance are made with the metrology system MET (FIG. 2). Different forms of advanced process control can be implemented. Advanced process control (APC) functions can be integrated in the supervisory control system, or performed in a stand-alone processing system. In one known system, three main process control loops are implemented.

The first loop provides local control of the lithography apparatus using a stability module and monitor wafers. Monitor wafers are exposed with a calibration pattern to set 'baseline' parameters for focus and overlay. At a later time, a metrology apparatus 140 reads these baseline parameters, which are then interpreted by the stability module so as to calculate stability corrections. This performance data can be fed back to the lithography cell, and used when performing further exposures.

The second (APC) control loop is based on measurements of performance parameters such as focus, dose, and overlay on actual product wafers. An exposed product wafer is passed to metrology apparatus 140, which may be the same or different to the metrology tool 140 in the first control loop. Information relating for example to parameters of performance such as critical dimension, sidewall angle and overlay is determined and passed to an Advanced Process Control (APC) module. This data is also passed to the stability module. Process corrections are calculated and used to control the lithocell, in communication with the stability module.

The third control loop is to allow metrology integration into the second (APC) control loop, for example in double patterning applications. These control loops, and variations of them, have been described in various prior published applications, and need not be described further herein.

Alignment Process Using Thermal Modeling

Returning to the alignment process described above with reference to FIG. 2, an advanced lithographic apparatus and associated control system may include a thermal model describing behavior of one or more thermal characteristics of components within the lithographic apparatus. Such a thermal model can be used to simulate the influence of changes in temperature of various components that occur as a function of operations causing heat input to the components, and the passage of time in between those operations. Typically the model is expressed in terms of parameters affected by temperature change, rather than modeling the temperature directly. In particular, the thermal model is expressed in terms of parameters that are already modeled and adjustable in the control systems of the lithographic apparatus. There are many examples of such parameters, including dose and image size.

A main cause of heat input in operation of a lithographic apparatus is the radiation used to transfer an image from a patterning device to a resist layer on the substrate. This cause of heating will be referred to below as a main example. However, other sources of heat input can influence performance, and the present disclosure is not limited to modeling any particular cause. For example, heat input may come from one or more mechanical actuators in the lithographic apparatus. Different product layers may use the actuators differently, meaning the heat input is different for different lots.

Figure 3:
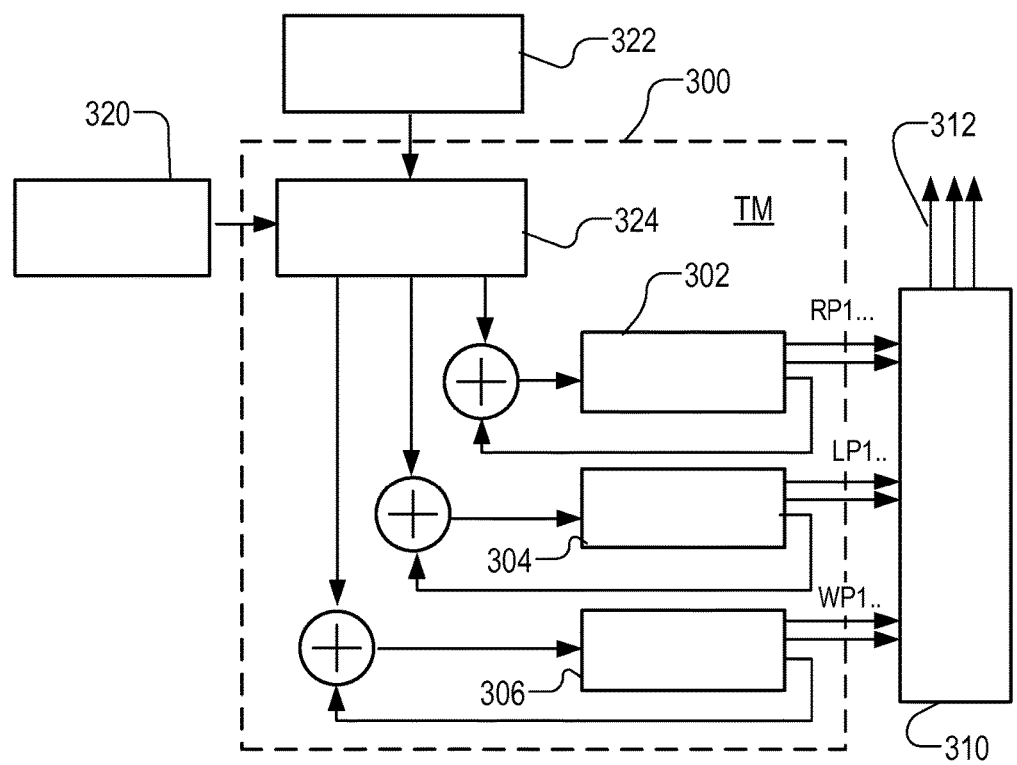
FIG. 3 is a schematic diagram of a thermal model of the apparatus of FIG. 1 operating to provide corrections in a control system lithographic apparatus.

FIG. 3 shows an example of a thermal model 300 that may be a computer-implemented module within the lithographic apparatus control unit LACU and/or supervisory control system SCS. The thermal model 300 is designed to simulate the thermal behavior over time of different components within the lithographic apparatus. Within thermal model 300, for example, there may be a reticle heating model 302, a lens heating model 304 and a substrate heating model 306. Each of these sub-models keeps track of one or more heat levels in one or more associated components.

A plurality of reticle heating parameters RP1 etc. represent thermal states of the reticle (patterning device MA) and patterning device support (mask table) MT. each reticle heating parameter may represent a different component of heat distribution within the reticle or mask table, and/or heat in different physical components. For example, a complex heating pattern may be resolved into components such as expansion in the X direction, expansion in the Y direction, pincushion expansion and so forth.

Similarly, in the lens heating model 304, lens heating parameters LP1 etc. describe different components or modes of heating influencing the performance of the projection system PS. Again, these parameters may be expressed in terms of their influence on magnification, astigmatism, focus or the like. In the substrate heating model 306, substrate heating parameters WP1 etc. describe different components or modes of heating causing distortion of the substrate W and/or the substrate table WT.

Because these various thermal parameters change during the course of exposing a field, a wafer and a lot, their influence cannot be fully corrected by calibration models. Accordingly, when high accuracy is desired, the various thermal parameters generated by thermal model 300 can be used in an exposure correction module 310 to generate additional corrections to compensate the time-varying thermal effects. These corrections can be set on a per-lot basis, on a per-wafer basis, and/or on a per-field basis.

Because these various thermal parameters depend on details of the operating sequence, and the differences between individual reticles, substrates and exposure recipes, thermal model (TM) 300 receives recipe information 320 and operating sequence information 322. A heat input module 324 models, over time, the heat input to each component of the heating sub-models 302-306, adding the heat input to the residual heat existing within the model. In the absence of heat input, naturally each heating model 302-306 will simulate the dissipation 312 of heat in accordance with one or more thermal time constants. These time constants represent of course the heat capacity of the physical components that are involved, as well as the action of dissipation and/or active cooling systems that may be present.

To calculate the heat input to each component, information of the operating sequence 322 includes the timing, for example, of all events in the processing of a sequence of lots of substrates, loading of substrates, exposure of fields, changing of substrates in substrate tables etc. For each lot, the heat inputs to various components during an exposure will be different. The speed of movements and the intensity of radiation dose during a field exposure can vary widely between lots. The illumination modes (distribution of radiation intensity within an illumination pupil) can vary widely. The transmission, reflection and absorption characteristics of the reticle, the projection system and the substrate can vary widely as well. Accordingly, for one layer in a product, the recipe information 320 defines layer-specific operating conditions to be used in the heat input module.

As an example, layer-specific operating conditions may include any or all of the variables just mentioned. For example, a reticle transmission factor (RTF) represents a portion of illuminating radiation that passes through the reticle MA into the projection system PS. A first reticle designed to pass small areas of light within a generally dark field will be subject to a far greater heat input rate for a given radiation dose than a second reticle that is designed to create small areas of dark within a generally bright field. Conversely, heat input to the lens heating model 304 may be greater for the first reticle than for the second reticle. Similarly, depending on previous processing and existing material layers, a substrate being printed with one layer of a product may have a far greater radiation absorption coefficient than a substrate prepared for another layer. Therefore, depending on a wide range of variables, every individual product layer within the manufacturing process for a variety of products can give rise to very particular thermal behaviors, among the thermal characteristics modeled by the thermal sub-models 302, 304, 306. Because of the time dependency (thermal time constants) in the various components of the apparatus, there is also substantial interplay between the heat input from one field to the next, from one substrate to the next, and from one lot to the next.

Figure 4:
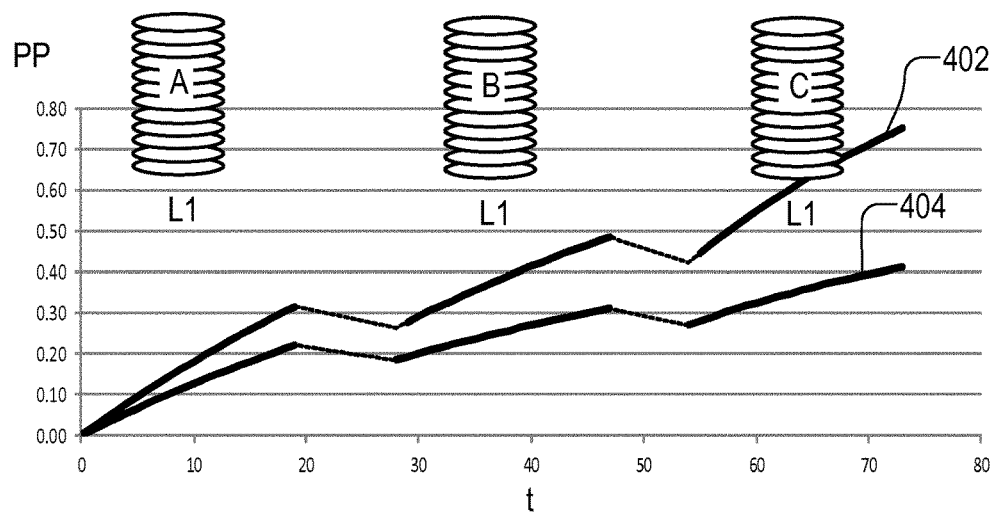
FIG. 4 illustrates the occurrence and partial correction of transient thermal effects control system of FIG. 3.

FIG. 4 illustrates schematically the behavior of one performance parameters PP over time t, when the lithographic apparatus is processing a sequence of lots of substrates. Performance parameter PP could be for example an explicitly thermal characteristic, such as a lens heating parameter. Alternatively, performance parameter PP could be a parameter that is indirectly influenced by thermal characteristics. The illustrated lots A, B, C are all related to the layer L1, which is one particular layer of one particular product. The layer-specific operating conditions associated with lots A, B, C will normally be identical. However, because of the time-dependence of the thermal model, the state of performance parameter PP is not the same for these three lots, even though they are identical. As shown in the curved 402, the first lot A causes a substantial rise in temperature, and hence in the parameter PP, while subsequent lots cause an increase in heat, but with a tendency for the temperature to stabilize. Based on the thermal model 300, a correction is applied to counteract the heating effects, leading effectively to a reduced increase in the performance parameter. The residual influence on the performance parameter PP is plotted at 404. Consequently, overlay errors (or other performance errors) introduced by distortions of the lens, though not eliminated, are at least reduced.

A typical semiconductor production facility may process in the same day many different lots of different types of products, and different layers of those types of products. Even the same lithographic apparatus 200 may receive a collection of lots to process which are mixture of different layers, having different layer-specific operating conditions defined in their recipes. Correction models cannot accurately model the thermally-induced errors under every possible sequence. The inventors have recognized that thermally-induced errors become more severe under some sequences than others. However, even if a manufacturing facility operator has the flexibility to process a given collection of lots in different sequences, no tool currently exists to automate or advise on the best sequence to use.

Lot Sequence Optimization

The present disclosure proposes an automated tool for improving performance of a lithographic manufacturing system, based on optimization, or at least improvement of lot sequencing. At any given time, there may be dozens of lots ready for processing by a given lithographic apparatus. This collection of lots may be referred to as the "lot queue". New lots may be added to the queue all the time as other lots are processed. Depending on the flexibility of the handling systems in the production facility, the ordering of the lots becomes fixed as they are approach their turn to be processed. For example, the next five or ten lots may be substantially committed to processing in a certain order, for smooth operation of the facility. If there are 50 or 100 lots in the queue overall, however, there is significant freedom to reorder the lots, to reduce thermally induced errors in the processing of some or all of them.

Figure 5:
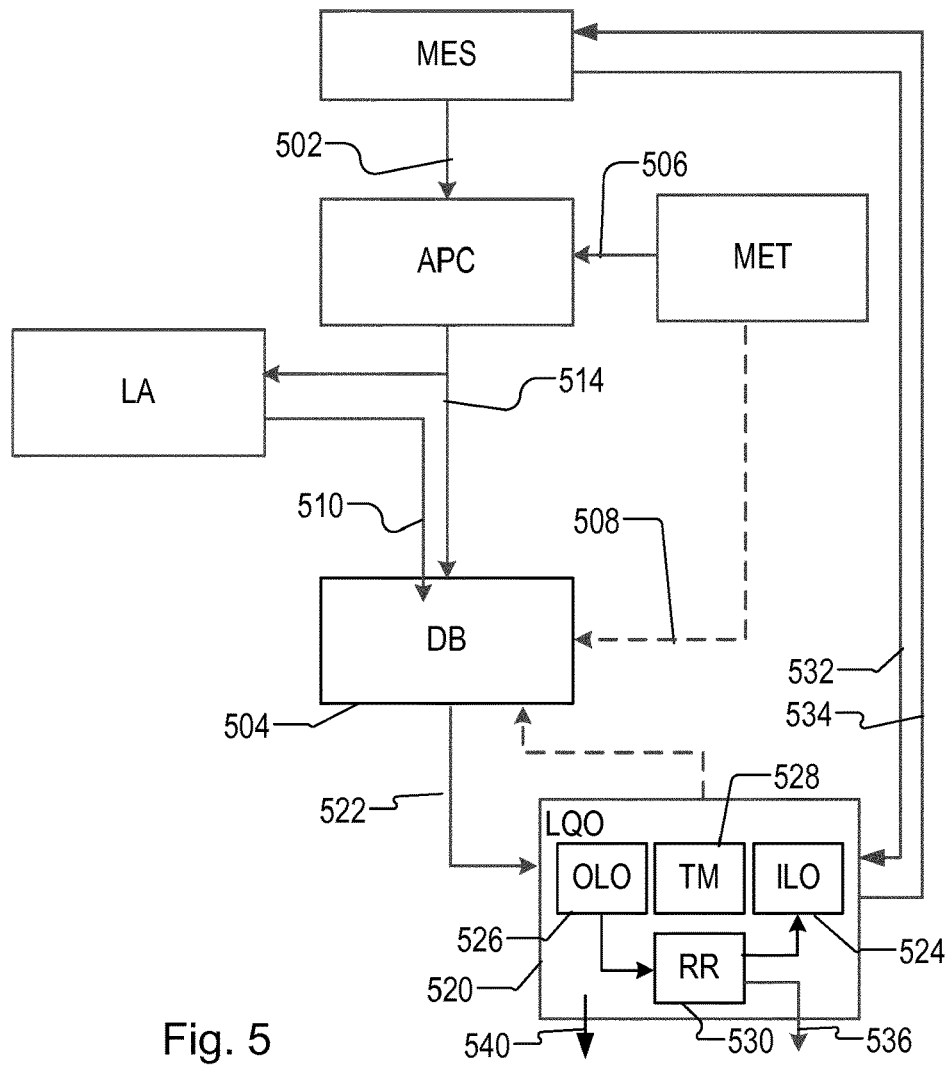
FIG. 5 illustrates the inclusion of a lot sequence optimization module in control system and lithographic apparatus, according to an embodiment of the present invention.

FIG. 5 illustrates schematically the interaction of various hardware and processing components of the lithographic production facility, implementing the control systems described above, and incorporating a lot sequence optimization function. At the left and right hand sides, a lithographic apparatus LA and a metrology system MET can be seen. Lithographic apparatus LA may be, for example, the lithographic apparatus 100 of FIG. 1. The metrology system MET may include, for example, the metrology apparatus 140 of FIG. 1. A manufacturing execution system MES is provided which issues a command 502 to the supervisory control system SCS of the lithocell to begin processing a given lot (batch) of wafers. Although only a single lithographic apparatus LA is shown in this diagram, the same manufacturing execution system and supervisory control system in practice will operate with at least a cluster of lithographic apparatuses, working in parallel in a high-volume manufacturing environment. Using the various control loops described relation to FIG. 3 above, process corrections can be applied across all the apparatuses, in addition to corrections specific to each individual tool.

The system of control is referred to herein as the supervisory control system SCS can comprise various different sub-systems, depending on the way the particular manufacturing facility is organized. In the example of FIG. 5 an advanced process control module APC is shown separately from the manufacturing execution system MES and separately from a lithography information system (database) 504. These systems can be regarded as components within the supervisory control system SCS shown in FIG. 1. They can be implemented in a common computing system, or they can be separate systems in practice. The APC system may for example be provided and run by a production facility operator and/or metrology equipment supplier, while the other elements of the SCS are more closely integrated with and supplied with the lithographic apparatus. In FIG. 5, an advanced process control module APC uses historic performance data 506 and context data about the present lot, to calculate process corrections 514 in accordance with one or more active control strategies. The historic performance data may, for example, comprised measurements of overlay, focus or CD, which are parameters to be controlled in the ongoing operation of the lithocell. The process corrections 514 are supplied to the lithographic apparatus LA.

Database 504 also receives data from various sources, including context information from the MES, and the lithographic apparatus LA. Information 510 received from the lithographic apparatus can include detailed context information, and information of the thermal constants and set up of the thermal model 300 generally. Information 510 received from the lithographic apparatus can also include information of alignment measurements and correction recipes, including sub-recipes for inter-field and intra-field components, and other situation-specific corrections. These may be received directly or indirectly from the lithographic apparatus LA or from the MES. Database 504 may also receive performance data 508 such as overlay data from metrology system MET after wafers have been processed through the lithocell. Instead of or in addition to receiving performance data directly, information obtained by processing the performance data for similar lots and different lots may be obtained from the APC module.

Within database 504, but shown separately in FIG. 5, the lot sequence optimizer module 520 is provided. Module 520 is particularly configured to use or replicate some or all parts of the thermal model (TM) 300 that is used in controlling the lithographic apparatus LA. Information 522 is obtained from database 504 giving full details of the processed and lots, including context information, such as recipe information 320, used in the thermal model illustrated in FIG. 3. Information 522 includes in particular an event log detailing the exact sequence of processing lots and wafers within lots, including events such as starting and ending of exposures that influence the heat input in the thermal model 300.

One implementation of the lot sequence optimizer comprises an in-line module 524 and an off-line module 526. Either of these can be omitted, if desired. Both will be described in more detail further below. Also within the lot sequence optimizer is the thermal model 528. Optionally a set of lot sequencing rules (RR) is defined, as indicated at 530. In one implementation, the lot sequencing rules are generated by the off-line module 526 and used by the in-line module 524.

In-line module 524 operates in real time with the manufacturing execution system (MES) to optimize the sequencing of lots being processed by the lithographic apparatus LA. As already explained, the MES maintains a current list of lots queued for processing. The queued lots may already be assigned a nominal sequence, for example based on the sequence in which they were added to the list, with or without some further prioritization. Some of the lots may already be committed to be processed in a fixed sequence, but for others the option remains to alter the sequence, to obtain performance benefits. In-line module 524 receives the current queue information 532 and returns optimized sequence information 534 for use by the MES in controlling the processing.

In-line module 524 may generate the optimized sequence information 534 on the basis of the thermal model 528 directly or indirectly. For example, in-line module 524 may operate directly using the thermal model to evaluate one or more alternative sequences for the lots specified in the queue. Alternatively or in addition, in-line module 524 may generate the optimized sequence information 534 based on the lot sequence rules 530, which have been generated using the thermal model by the off-line module 526.

In-line module 524 may run every time a new lot is added to queue for processing, or it may be run less frequently. The appropriate frequency can be determined based on various factors. Such factors may include, for example, the computational burden of the optimization process, the lag between new lots being added to the queue and the lot becoming committed to a particular sequence, and the operational penalties (if any) associated with changing a sequence, once lots have been put in motion.

Turning to the off-line module 526, this also could operate in real time, but in the present implementation is arranged to operate without the time constraints. The off-line module could be on a different computer system, remote from the production facility, if desired. It could be run on occasionally, if the mix of lot types and operating environment are relatively stable.

Using the event log, the context information such as the recipe information 320 and knowledge of the thermal model 300, off-line module 526 considers the information relating to a given collection of lots that have been processed by the lithographic apparatus, and evaluates whether a different sequence of processing those lots might have led to improved performance, by causing a different behavior of the thermal model 300/528. As mentioned already, one output of the off-line module may be a set of lot sequencing rules 530. These rules can take many forms. As a simple example, the lot sequencing rules may specify a preferred sequence of processing, for use in the event that a collection of lots having exactly the same product and layer types within it, should be assigned for processing in the future. In some production environments, the variation of lot types may be minimal. Alternatively or in addition, more flexible lot sequencing rules may be generated, and used to define more optimal processing sequences for different collections of lots that may be assigned for processing in the future. These lot sequencing rules can be provided to the in-line module 524 and used to generate the optimized sequence information 534, so that the optimum sequence will be implemented automatically by the manufacturing execution system MES. The lot sequencing rules may also be output separately, as shown at 536. The rules be output for a variety of purposes, including simply for information and study. For example, having devised the rules in this particular lithographic tool and production facility, they be useful in another lithographic tool or production facility, handling a similar mix of lots.

Optionally, using performance data such as overlay data from metrology system MET and/or context data from the APC module, the off-line module 526 can evaluate performance improvements that may be associated with following or not following any or all of the lot sequencing rules or optimal sequences. These data can be used, together with the thermal model 528 to improve the evaluation of different possible sequences.

In one implementation, off-line module 526 generates a report 540 to inform an operator that, where a given collection of lots has been processed and incurred a certain performance penalty in terms of overlay, CD or other parameter of interest, performance can be improved by a certain amount, by following the optimal lot sequence in the event that a similar collection of lots is to be processed in future. Particularly in the case where the optimized lot sequence may incur some penalty in cycle time, for example, the operator can then evaluate a trade-off between the performance improvement and the throughput penalty.

Figure 6:
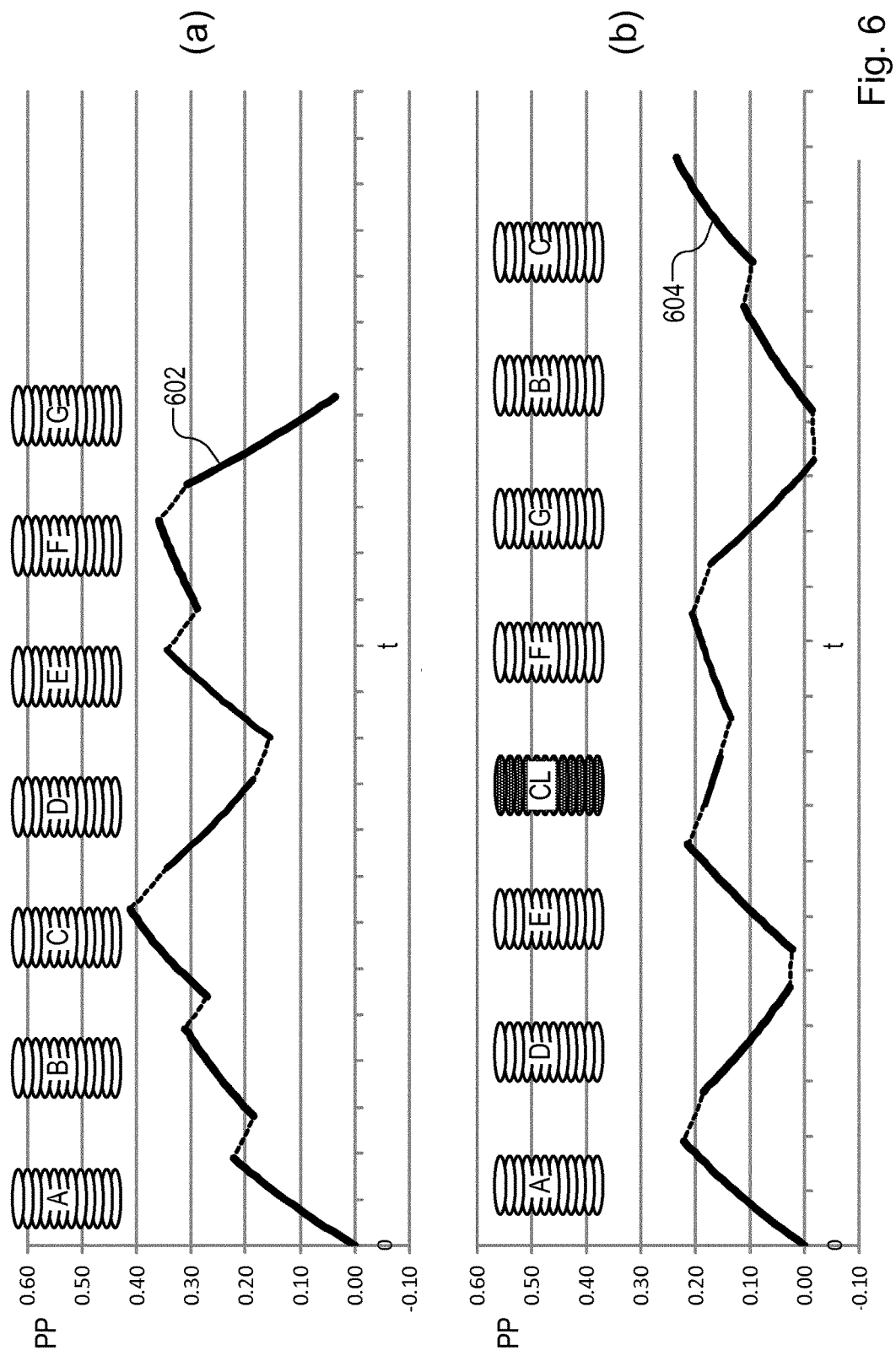
FIG. 6 illustrates, in a simplified scenario, example functions of the lot sequence optimizer.

Referring now to FIG. 6, we see a simple illustration of (a) a non-optimal processing sequence for a collection of lots labeled A to G, and (b) and optimized sequence of the same lots, that might be suggested by lot sequence optimizer module 520, in the system of FIG. 5. Below each sequence, a graph represents variation of a thermally-influenced performance parameter PP over time t. The parameter PP in these graphs is assumed to be the residual of the performance parameter, after correction by the thermal model in normal operation. That is to say, the curves 602, 604 in FIG. 6 correspond to the curve 404 in FIG. 4. The thermal variations themselves may be greater, before correction. The vertical scale is arbitrary.

In this simple example, the reader will see from the explanation below, how the lot processing sequence (a) is non-optimal, and how an improved lot sequence (b) can be devised. In a real situation, however, there may be dozens of product types, and/or dozens of different layer types, or mixed among the collections of lots that are to be processed. As each of these can have very different lot-specific operating conditions, and very different contexts in terms of the lots processed before and after them, the problem of identifying an optimal lot sequence in advance of processing the next collection of lots is quite intractable by current knowledge.

Referring to the non-optimal sequence (a), it will be seen that the lots are processed simply in the order A to G. In the graph below the lot sequence, a trace 602 of example parameter PP is plotted against time t. Based on the same information, this plot represents the residual value of the parameter as is calculated in the thermal model 300 during processing of these lots, as well as a calculation of the same residual in a simulated calculation of the thermal model 528, performed in lot sequencing optimizer module 520.

In this very simple example, the lots A to G include three or four types. Lots A, B, C, E and F are all of types in which the parameter PP increases in the course of the lot. Lots D and G are of types in which this particular parameter PP decreases. Other parameters may show different behaviors in the course of processing the same lots. For example, while lens heating parameter is falling, a reticle heating parameter might be rising. That is to say, the lot-specific operating conditions for some lots may involve a certain radiation dose passing through a reticle having a high reticle transmission factor, while the lot-specific operating conditions for other lots may involve the lower radiation dose passing through a reticle having a high reticle transmission factor, or may involve a high radiation dose being relatively blocked by a reticle having a low reticle transmission factor.

The criteria to be used in determining the optimum sequence can be determined by the system designer, and/or the system operator. For example, an optimization goal could be to keep variation of the parameter PP within a certain range. As seen in FIG. 6(a), accumulation of thermal effects over lots A, B, C leads to higher and higher values of parameter PP. The optimized sequence (b) in FIG. 6 changes the order of processing the lots, so that lot A with the rising thermal profile is followed by a lot D with a falling profile. In this way, accumulation of thermal effects is avoided, and the variation of parameter PP (trace 604) is kept substantially within the range ±0.2, where the trace 602 for the original sequence incurred variations as high as 0.4.

The optimized sequence (b) can be obtained purely by switching the order of processing certain different types of lots. In addition, the lot sequence optimizer module may be arranged to insert a so-called conditioning lot CL. An example of a conditioning lot is shown inserted after the processing of lot E, and prior to the processing of lot F. Motivation for inserting a conditioning lot might be difficulty in reordering the lots, due to limitations of the handling equipment, or due to the lots G etc. not being ready in time to be processed immediately after lot E. The conditioning lot may comprise dummy wafers, purely for establishing a certain thermal behavior, and does not impact the performance of real product wafers. Another type of conditioning lot might be product wafers having similar lot specific operating conditions, but less critical performance parameters.

Instead of limiting the value of the parameter PP by avoiding accumulation of thermal effects, another criterion for use in optimization might be to minimize variations. That is to say, it may be that a performance improvement can be obtained by "saturating" the thermal effects at a steady value, even a high value. This would be a preferred option where, for example, variation of thermal effects is more challenging for the correction of alignment errors, focus errors or the like, while periods when the heating parameters are in a relatively steady state are less challenging.

In a simple example in which there are only a few lots, and only two types of behavior in one parameter, sequencing could perhaps be optimized by simple rules devised by a human expert. In general, however, the diversity of products and layers being processed does not allow such a simplistic rule. Nevertheless, because an automated system equipped with real and/or simulated sequences and equipped with a thermal model the same or equivalent to the thermal model 300 can identify an optimal, or at least more optimal sequence for any given collection of lots.

Figure 7:
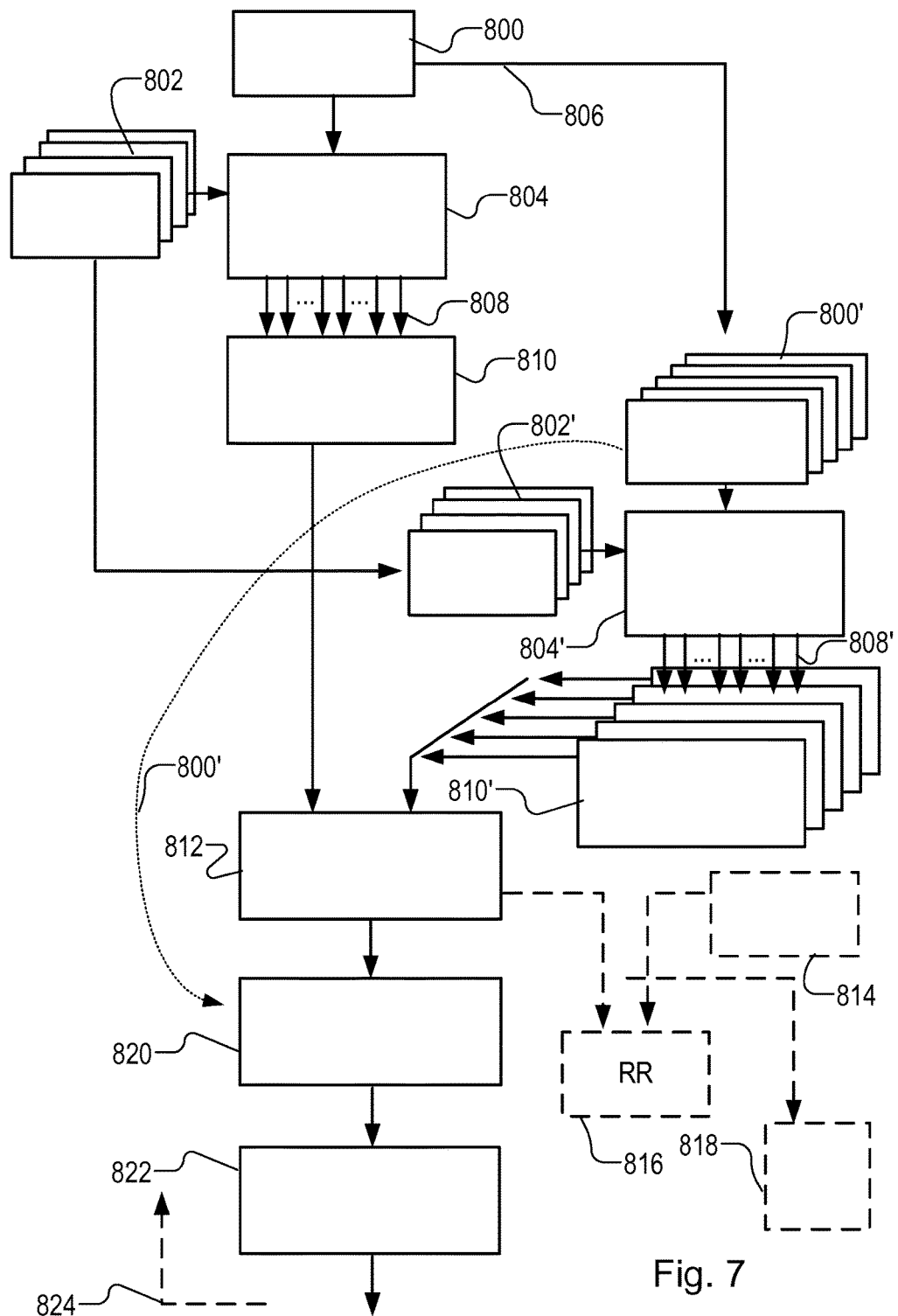
FIG. 7 is a schematic flow diagram of the lot sequence optimization method in an example embodiment of the present invention.

Referring now to FIG. 7, implementation of the lot sequence optimizer 520 can be done in a number of ways. FIG. 7 illustrates schematically some principles of the lot sequence optimization techniques disclosed herein, and some variants, that can be implemented in a practical embodiment. Specific methods for the in-line module and the off-line module will be described further below, with references to FIGS. 8 and 9.

In a step 800, a collection of substrates are specified as a lot queue, ordered in an arbitrary lot sequence. This is the sequence indicated at 322 in FIG. 3. This sequence of processing of the substrates is commanded by the manufacturing execution system, for example. It may be an arbitrary sequence, or it may be informed by previous iterations of the lot sequence optimizer method disclosed herein. Using recipe information 802 defining the lot-specific operating conditions for all of the different types of lots within the collection of lots, a thermal model 804 is operated in the same way as thermal model 300 in the example of FIG. 3 (528 in FIG. 5) and generates time-based profiles 806 of one or more characteristics of thermal behavior of components within the lithographic apparatus. These characteristics are represented, for example, by reticle heating parameters, lens heating parameters, substrate eating parameters and the like.

In the course of controlling the processing of the substrates, an event log 808 is generated, recording the occurrence and timing of numerous events involved in the processing of the lot of substrates. In addition to being used to generate corrections in the processing of the substrates, the profiles 808 are recorded in a historical performance store 810. Next, using recipe information 802' which is the same as that used in the processing of the real lots, a thermal model 804' is operated to calculate simulated profiles 808' of the same thermal characteristics, for a number of alternative sequences defined at 800'. These alternative sequences 800' can be generated in numerous ways, and in principle all possible permutations of a given collection of lots can be generated and processed through the thermal model 804'. The thermal models 804, 804' may be regarded as instances of the thermal model 528 shown in FIG. 5.

The simulated profiles 808' of thermal characteristics for the alternative sequences 800' are stored in an alternative performance store 810'. At 812 the thermal profiles are compared, either directly or indirectly, with each other and with the thermal profiles recorded in the historical performance store 810, to identify an optimal sequence for the given collection of lots. By "indirectly", we mean that they may first be analyzed in accordance with the desired optimization criteria, before the results of such analysis are compared. These criteria may be expressed for example in terms of desired ranges for one or more performance parameters, or a preference for steady-state portions Optionally, as discussed above, performance data 814 from the APC module can be used also to simulate performance parameters of the process, such as overlay and CD, for comparison with performance obtained in the actual at 800, processing of the substrates (historical) exposure sequence. These data can be used at 816 to generate a set of one or more lot sequencing rules, using also on the collection of alternative and historic profiles, stored at 810 and 810'. In parallel, at 818, optionally a measure of available performance improvement in terms of CD, overlay etc. can be associated with the determined lot sequencing, based on the APC data 814.

Returning to the main flow, at 820, a specification of the optimum sequence and optionally the available performance improvement is output. At 822 this optimized sequence is used by a human operator and/or automated lot sequencing system, to control the manufacturing execution system MES in the sequencing of collections of lots that are assigned for processing in future.

As will be appreciated, the composition of lots will evolve over time, and there will also be further real-world experience of performance to be gained, after the first optimized sequence has been implemented. Accordingly, the process illustrated in FIG. 7 can be made continually or occasionally iterative, returning at 824 to repeat the optimization as required. Data from all historic runs can be aggregated infinitely, or with time weighting, so that the lot sequencing rules established at step 816, for example, are not newly established from nothing, but are refinements of lot sequencing rules developed in previous iterations.

Different methods can be envisaged for performing the comparisons at step 812, and for establishing the lot sequencing rules at 816. As mentioned, the basis for evaluation and comparison of the thermal behavior of different sequences can be based on identifying transient and steady-state portions of the profile of one or more characteristics of the thermal behavior. Additionally, within the sequences 800, 800', transitions between lots related to different layers can be identified. A statistical analysis of the results can be performed to associate greater and lesser effects with specific sub-sequences of lots. As a simple example of sub-sequences, one can identify simply pairs of lots, such as layers L1-L1, L1-L2, L2-L1 and so forth. Longer sub-sequences of three or more lots can be defined, to capture thermal effects extending over multiple lot intervals, such as were seen in FIG. 6. By performing statistical analyses on these lots based simply on their layer ID, there is no need to attempt an analytical treatment of the individual variables of the lot-specific operating conditions. In principle, such an analytic treatment could be attempted, but simple statistical analysis based on layer ID may be more rapidly implemented, and bring significant benefits.

Similarly, an attempt may be made to identify different layer IDs for which the lot-specific operating conditions are the same or similar, either by statistical analysis of the sequences and resulting thermal profiles, or by direct analysis of the recipe information 802. Again, this complicates the method, and, with a sufficiently large sample of different lots, the similarities between different layer IDs will be recognized statistically in the lot sequencing rules without analytic intervention.

The form of the lot sequencing rules can vary according to preference, and according to the situation. As mentioned, one option would be to define a lot sequencing rule for every different combination of layer IDs that might arise in the given collection of lots. Where a collection or sub-collection has been seen before, and an optimum sequence has been determined, the lot sequencing rules may simply dictate "process (sub-)collection of lots X in sequence Y". Referring, for example, to FIG. 6, the rule could be expressed "when lots of type A, D, E are available, process them in the sequence A, D, E". Another rule might be "when lots of layer L1 and lots of layer L2 are to be processed, interleave the layer L1 lots and the layer L2 lots".

For more flexibility in the application of the lot sequencing rules, they may alternatively be expressed in terms of favored and/or unfavored sub-sequences. In the simple case, favored and/or unfavored sub-sequences may be simply pairs of layer IDs that should or should not be processed in succession. Referring, for example, to the situation in FIG. 6, there may be established a pair of rules that say: (i) "a layer L1 lot should not be processed immediately after a layer L1 lot", where lots A and E are examples of layer L1 lots. Another rule might be specify that a conditioning lot should be inserted to avoid breaking another rule, or to avoid the performance parameter exceeding its desired range. Naturally, such rules could be encoded in natural language as just stated, or more likely they will be encoded in a suitable mathematical representation or algorithm.

Given the full set of stored historic performances and alternative performances 810 and 810', a systematic approach to the generation of lot sequencing rules of this type can be taken. It should also be borne in mind that, in the real system, there may be numerous thermal parameters, some of which exhibit transient behavior with one sub-sequence of lot types, while others remain in steady-state, and vice versa. In evaluating which are the preferred profiles in this the comparisons step 812, the different thermal characteristics can be given a weighting, or ignored completely according to their impact on product performance. Data from the metrology system 140 and/or the APC module can be useful in this regard. Engineering knowledge, for example about the types of error "fingerprint" that cause performance problems in a particular product or layer, can also be encoded in the comparison step 812.

Subject to the complications just discussed, in simple terms a systematic approach to establishing a set of lot sequencing rules can be adopted. Using all the recorded data, there can be established a table of which each row represents a given sub-sequence of two, three or more lot types (layer IDs) observed in the historic processing of actual lots and/or in the simulated processing of real or hypothetical collections of lots by alternative sequences. Along each row of the table, one or more characteristics of the thermal behavior output by the thermal model the 804/804' can be entered. As mentioned, these may be characteristics expressed particularly in terms of transient versus steady-state behavior. Actual rates of change of the parameter may be entered, or a simplified "score". (As mentioned, these scores can be weighted, if necessary, according to the impact a particular heating parameter will have on the performance of the finished product.)

Having constructed the table based on the available real and/or simulated behaviors, each row of the table can be assigned a ranking, according to the favorability or on favorability of the thermal behaviors observed in the row. In the example where favorability or on favorability is based on transient versus steady-state behavior, a particular sub-sequence of two or more lot types will be scored as relatively undesirable, if that row of the table indicates strongly transient thermal behaviors. Similarly, a particular sub-sequence might be scored as unobjectionable, if that row of the table indicates strongly steady-state thermal behaviors. It is a matter of design choice, whether rules are expressed in terms of both what is favorable and not favorable, or are expressed only in terms of unfavorable (forbidden) sub-sequences.

While the above examples are based on review of previously processed lots, and/or simulated processing of lots, leading to the defining of a set of one or more lot sequencing rules, this is merely one convenient implementation. In particular, such examples have the advantage that they can be implemented in "off-line" processing facilities, without interrupting the critical real-time control systems involved in processing real substrates. The lot sequencing optimization calculations can be performed without time pressure, and can even be performed on hardware remote from the lithographic apparatus itself. On the other hand, with suitable processing power and assurance of system availability, "inline" lot sequence optimization can also be envisaged. In that case, simulation of thermal behavior could be performed in advance of processing a given collection of lots, to determine an optimal sequence, such a method would have the benefit that lots of a type not seen before could be subject to optimization, based on the lot-specific operating conditions that can be defined from their associated recipe information. Whether such a benefit justifies the complications of an online implementation is a matter for the implementer. However, the present disclosure is not limited to off-line implementations or in-line implementations. Either or both may be included in a given implementation.

Figure 8:
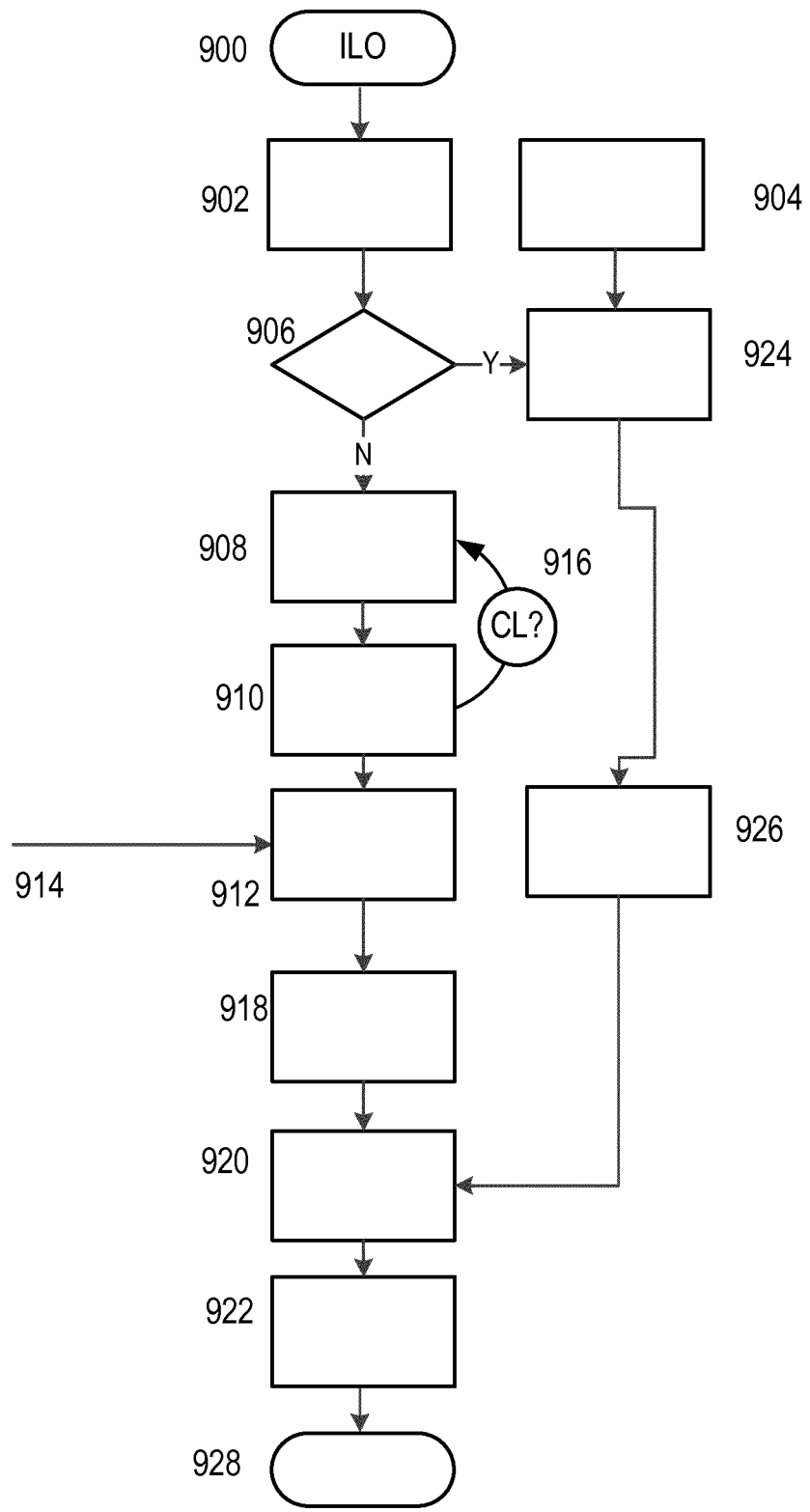
FIG. 8 is a flowchart of a method implemented by an inline module of the lot sequence optimization module in an example embodiment of the invention.

FIG. 8 is a flow chart for a method of in-line sequence optimization, such as may be implemented in the in-line module 524 of FIG. 5. The method is triggered at 900, for example in response to one or more lots being added to the current lot queue. At 902, details of the queue, including recipe information, and a current sequence are received. Optionally at 904, lot sequencing rules are retrieved. At 906, a decision is made whether lot sequencing rules are available, and whether to use them. Following firstly the "N" branch from decision step 906, at 908 some or all of the possible alternative sequences are determined. At 910, the performance of the lithographic process using these alternative sequences is simulated using the thermal model.

At 912, the possible alternative sequences are evaluated by reference to criteria received at 914. This may be a ranking process, and the ranking criteria may be defined by a system operator. The criteria may be expressed in terms of a single thermally-influenced parameter, or a combination of several parameters. Optionally, the criteria may specify mandatory performance levels. For example, referring to the example of FIG. 6, there may be a rule that the parameter PP must not exceed 0.0, or some other level. In the event that none of the possible sequences satisfies the criteria, modified sequences can be defied at step 916, using for example conditioning lots. Conditioning lots can be inserted iteratively until one or more acceptable sequences is found.

When an acceptable set of possible sequences have been found and ranked, at step 918 an optimized sequence is identified based on the ranking. At 920, the (expected) performance of this optimized sequence is compared to that of the current sequence. This comparison may be based on score values, as discussed further below. If the newly optimized sequence scores better than the current sequence, at 922 the optimized sequence is returned to the MES for use in controlling processing of the substrates. If the optimized sequence scores no better than the current sequence there may be a report sent to that effect, or no report at all. This is a matter of design choice in the interfacing of the lot sequence optimizer module with the existing MES.

In the event that lot sequencing rules are to be used, processing moves from step 906 to step 924. Here, all possible alternative sequences are determined that satisfy the lot sequencing rules. At 926 these are ranked according to any suitable criteria. The criteria need not be concerned with performance parameters or the thermal model, because the thermal model is implicitly considered in generating the lot sequencing rules. The criteria in step 926 might be for example limited to evaluating which sequence has the shortest cycle time. A best alternative sequence is identified and compared with the current sequence at step 920, and flow proceeds as before. At step 928, the method concludes until it is triggered again and flow returns to step 902.

Note that the same effect as the method of FIG. 8 can be achieved by performing the same or similar steps in different orders. The specific sequence of steps in this example is not to be taken as limiting on the scope of the disclosure.

Figure 9:
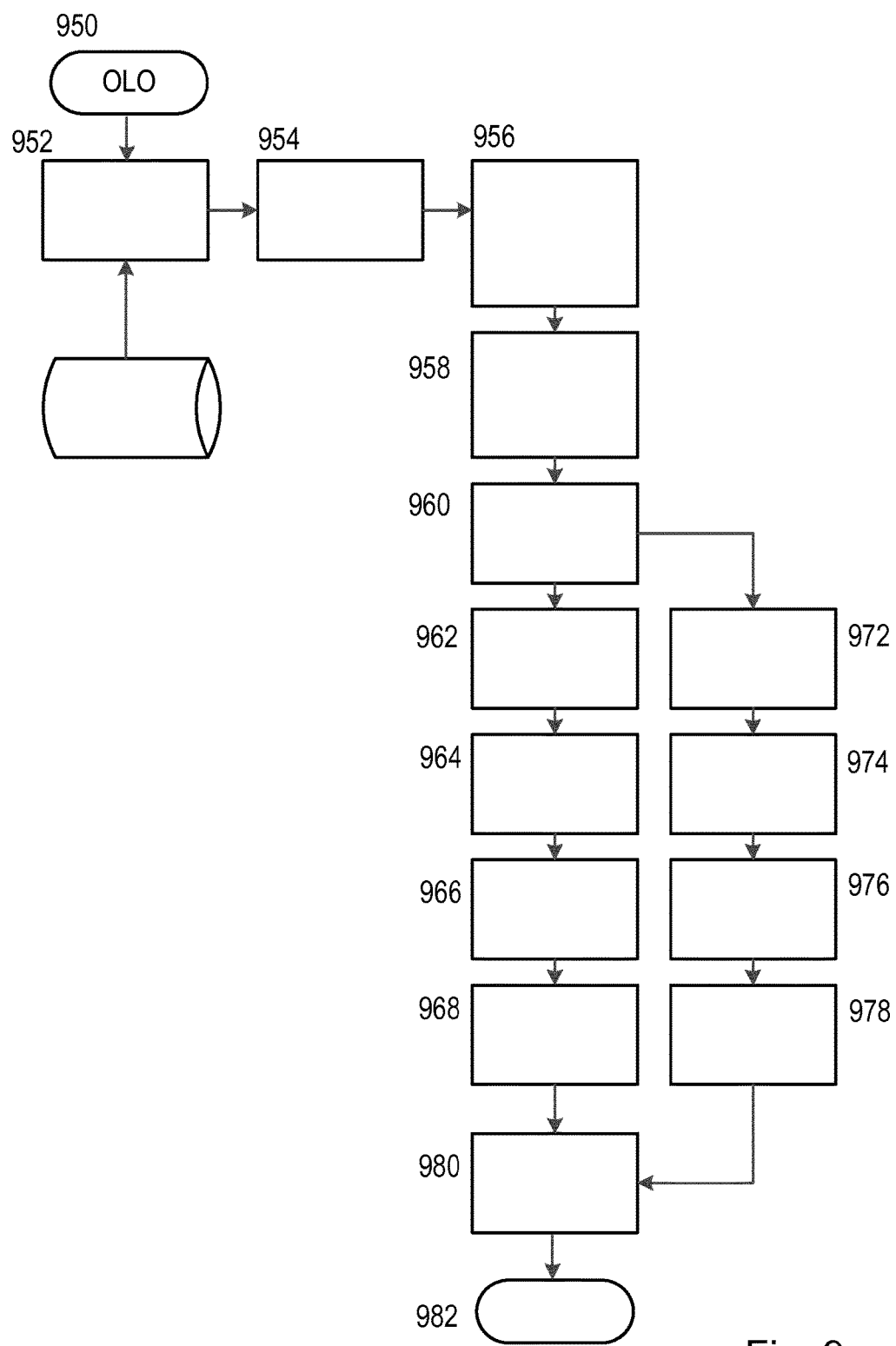
FIG. 9 is a flowchart of a method implemented by an off-line module of the lot sequence optimization module in an example embodiment of the invention.

FIG. 9 is a flow chart for a method of off-line sequence optimization, such as may be implemented in the off-line module 526 of FIG. 5. At 950, the method is triggered according to whatever criteria are set by the operator. The frequency of execution of the off-line module 526 can be the same as that of the in-line module 524, or it can be less frequent, as described already above.

At step 952, historic processing data and performance data for one or more past collections of lots are retrieved from the relevant databases. At 954, some or all of the possible alternative sequences that could have been considered are determined. At 956, the thermal model is used to calculate performance of the alternative sequences, in terms of one or more performance parameters PP. the performance parameter might be for example overlay, instead of or in addition to some parameter internal to the lithographic apparatus. A step 958 calculates for each sequence what would be the overlay performance, using that sequence.

At 960 the possible alternative sequences are ranked according to one or more desired criteria. As an example, the sequences may be ranked according to the lot-to-lot variation of overlay, rather than any absolute overlay value. After step 960, processing continues in one or more branches. In a first branch, at 962, a sequence ranked with the highest lot-to-lot variation (i.e. a "bad" sequence) is identified. At 964, within the identified "bad" sequence, those sub-sequences of two or more lots associated with the highest transition in overlay are identified. At 966, a negative lot sequencing rule is created, such as "do not process lot type XX before lot type YY". Rather than generate negative rules and positive rules as different types of rules, the favorability (or not) of a sub-sequence can be expressed in a score value. At 966, the negative lot sequencing rule may actually be expressed in the form "process lot type XX before lot type YY: score=low". All the sub-sequences are assigned either a high score (more favorable sub-sequence) or a low score (less favorable). At step 968, a low score value is assigned to this sub-sequence.

In another branch, at 972, a sequence with the lowest lot-to-lot variation of overlay is identified (i.e. a "good" sequence). At 974, the sub-sequences of lots with the lowest transitions in overlay are identified within the "good" sequence. At 976 a "positive" lot sequencing rule is generated such as "do process lot type YY after lot type ZZ". The sub-sequence is assigned a high score value at 978.

The two branches for the least favorable and the most favorable and sub-sequences are only examples. In practice, the method will identify a greater number of subsequences and associate rules (scores) with them. This can be done in an iterative manner, for example, following the examples just described. In other words, after identifying and scoring a "best" and/or "worst" sub-sequence, the method can proceed to identify and score a "next best" and/or "next worst", and so on. At 980, the full set of rules with their score values are stored in the database of lot sequencing rules, for use in the future operation of the lithographic apparatus, and possibly similar apparatuses.

Note that the same effect as the method of FIG. 9 can be achieved by performing the same or similar steps in different orders. The specific sequence of steps in this example is not to be taken as limiting on the scope of the disclosure. The particular manner of deriving the lot sequencing rules and the way of expressing them is only one possible example. Of course, it is a matter of choice whether favorable sub-sequences and sequences are assigned a high score or a low score. In the latter case the score serves as a kind of cost function, with the aim of the lot sequencing module being then to minimize the cost function. Alternative implementations can be envisaged, for example by ranking the sub-sequences without explicit score values. Using score values, however, the scores of all the sub-sequences making up a candidate lot sequence can be combined to rank entire candidate sequences.

While the lot sequence optimization is based on simulating the thermal behavior of the lithographic apparatus in the course of two or more different sequences of a given collection of lots, it is not required that the simulation is performed for two or more complete sequences. For example, there may be only part of a sequence that is deemed to require simulation. For example, the collection may involve lots of a type seen before, and one lot of a new type. Only sub-sequences involving the new sub-type might need to be simulated, to accommodate the new type in the dataset of lot sequencing rules. As another example, part way through simulating a particular sequence, the simulated thermal behavior may be already so much worse than a sequence already simulated, that continuing the current simulation would be pointless. Accordingly, the claims are not to be interpreted as requiring simulation of complete sequence, provided sufficient information is obtained about the thermal behavior to be expected when processing lots in that sequence.

The lot sequencing optimization may be based in part on simulating the thermal behavior and in part on hard-coded rules, without departing from the principles of the present disclosure. Additional refinements can be added, for example to allow prioritized handling of certain types of lot, or certain specific lots. Thus, for example, some lots with high priority may be tagged, and promoted to the front of the sequence, overriding the sequence that would otherwise have been proposed by the lot sequence optimizer based on the thermal model, based on the collection of lots currently in the lot queue. On the other hand, thermal effects should still be taken into account, and additional rules may be associated with the insertion of these high-priority lots. For example, cooling-down time, or conditioning lots of some kind may be instructed, before and/or after inserting a high-priority lot into the sequence. This instruction may be derived using the established lots sequencing rules, or directly using the thermal model, or it may be manually coded. In an implementation having an in-line lot sequencing optimization module using the thermal model, the instruction may be generated automatically by the method of FIG. 8, by applying additional constraints to prioritize the high-priority lots, when defining the candidate sequences.

Further embodiments of the invention are disclosed in the list of numbered embodiments below:

1. A method of determining a lot processing sequence for a lithographic apparatus, the lithographic apparatus being configured to apply patterns to a number of product substrates to define various layers of one or more products, wherein the method includes:
(a) using a thermal model to simulate thermal behavior of one or more components within the lithographic apparatus in response to layer-specific operating conditions associated with each lot when processing a given collection of lots in two or more different processing sequences; and
(b) based on comparison of the simulated thermal behavior in different sequences of lots, determining a sequence for processing a collection of lots to obtain a preferred thermal behavior.

2. A method according to embodiment 1 wherein in step (b) a preferred thermal behavior is one that avoids accumulation of thermal effects in one or more of said components.

3. A method according to embodiment 1 or 2 wherein in step (b) a preferred thermal behavior is one that minimizes variation of thermal effects in one or more of said components.

4. A method according to any preceding embodiment wherein the sequence determined in step (b) includes a conditioning lot in addition to the lots in the given collection.

5. A method according to any preceding embodiment wherein step (b) includes determining one or more lot sequencing rules for use in obtaining said preferred thermal behavior when processing a collection of lots in future.

6. A method according to embodiment 5 wherein said lot sequencing rules include one or more lots favoring one or more sub-sequences of layers, a sub-sequence comprising two or more particular layers in a particular order.

7. A method according to embodiment 5 or 6 wherein said lot sequencing rules include one or more rules disfavoring one or more sub-sequences of layers.

8. A method according to any of embodiments 5 to 7 wherein step (b) includes identifying a plurality of sub-sequences that occur one or more times in the simulated different sequences of lots, and ranking each identified sub-sequence according to characteristics of thermal behavior associated with occurrences of said sub-sequence in the sequences of lots whose thermal behavior is simulated.

9. A method according to any of embodiments 5 to 8 wherein step (b) further comprises using the lot sequencing rules when determining a sequence for processing a given collection of lots.

10. A method according to any preceding embodiment wherein in step (b) said given collection of lots is based on a collection of lots actually processed by the lithographic apparatus, and wherein said different sequences include one or more alternative sequences different than the one in which the real collection of lots was actually processed.

11. A method according to embodiment 10 wherein said different processing sequences include the sequence in which the real collection of lots was actually processed by the lithographic apparatus, as well as alternative sequences in which the same collection of lots might have been processed.

12. A method according to embodiment 11 or 12 wherein an event log is received from a lithographic apparatus, the event log defining a sequence of operating conditions in the processing of said collection of lots.

13. A method according to any preceding embodiment further comprising
(c) obtaining measurements of performance from a collection of lots actually processed in a real processing sequence;
(d) obtaining information of corrections applied in the patterning of the previously patterned lots; and
(e) calculating a prediction of performance measurements that would have been achieved, had the lots been processed using the sequence determined in in step (b).

14. A method according to any preceding embodiment further comprising a step (f) of controlling the lithographic apparatus to process a given collection of lots using the sequence determined in step (b).

15. A control system for a lithographic apparatus, the control system comprising:
   storage arranged to receive information defining a collection of lots to be processed;
   storage arranged to receive a set of one or more lot sequencing rules obtained by a method according to any of embodiments 5 to 8; and
   a controller for using the lot sequencing rules to determine a processing sequence for the defined collection of lots, and to control the lithographic apparatus to process the lots in the determined preferred sequence.
16. A control system according to embodiment 15, the control system further comprising a processor arranged to perform the steps (a) and (b) of the method according to any of embodiments 1 to 14.
17. A method of manufacturing devices wherein substrates are processed in a plurality of lots, the substrates within each lot receiving a particular layer pattern under layer-specific operating conditions while the substrates in other lots receive different layer patterns under different layer-specific operating conditions, thereby to define various layers of one or more products, wherein a collection of lots are processed in a sequence determined by a method according to any of embodiments 1 to 14.
18. A computer program product containing one or more sequences of machine-readable instructions for implementing the steps of a method of any of embodiments 1 to 14.
19. A computer program product containing one or more sequences of machine-readable instructions for causing a processing device or system of processing devices to implement the control system of embodiment 15 or 16.
20. A lithographic apparatus including a control system according to embodiment 15 or 16.

CONCLUSION

By the techniques disclosed herein, the currently existing methods for optimizing the sequencing of lots in a lithographic manufacturing facility environment comprise only the "best guess" or "trial and error". In a production environment where a wide variety of products and layers are processed through the same litho cell, potentially for different customers and with unfamiliar recipes, there exists no methodology for establishing an optimal lot sequence. Consequently, thermal variations caused by the transitions between lots of different types place limits on the performance that can be achieved in terms of important parameters such as overlay and CD.

The method disclosed herein exploits the existing knowledge that is encoded in the thermal model of the lithographic apparatus, to allow an automated or semi-automated determination of optimized sequences, the the by determining an optimum sequence for a given collection of lots, or by defining a set of more generally applicable sequencing rules. The method can be implemented in existing processing hardware, and integrated easily into the existing manufacturing facility control systems. New hardware is not required, to achieve improved performance.

In association with the hardware of the lithographic apparatus and the lithocell LC, an embodiment may include a computer program containing one or more sequences of machine-readable instructions for causing the processors of the lithographic manufacturing system to implement methods of model mapping and control as described above. This computer program may be executed for example in a separate computer system employed for the image calculation/control process. Alternatively, the calculation steps may be wholly or partly performed within a processor a metrology tool, and/or the control unit LACU and/or supervisory control system SCS of FIGS. 1 and 2. There may also be provided a data storage medium (e.g., semiconductor memory, magnetic or optical disk) having such a computer program stored therein in non-transient form.

Although specific reference may have been made above to the use of embodiments of the invention in the context of optical lithography, it will be appreciated that the invention may be used in other patterning applications, for example imprint lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may have been made above to thermal modeling of a "reticle", a "lens" or a substrate/substrate support, the same principles can be applied to the modeling of any component or sub-system of the lithographic apparatus. It will be appreciated that the "reticle" is only one example of a patterning device. A "lens" is only one example of an optical component or sub-system that may be included in a projection system for imaging a pattern onto a substrate. While heating affixed caused by the exposure radiation have been mentioned, other heat sources, including, for example mechanical actuators or other processing steps may also need to be taken into account.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:
1. A method of determining a lot processing sequence for a lithographic apparatus, the lithographic apparatus configured to apply patterns to a number of product substrates to define various layers of one or more products, and the method comprising:
   using a thermal model to simulate thermal behavior of one or more components within the lithographic apparatus in response to layer-specific operating conditions associated with each lot when processing a given collection of lots in two or more different processing sequences; and
   based on comparison of the simulated thermal behavior in different sequences of lots, determining a sequence for processing a collection of lots to obtain a preferred thermal behavior.

2. The method as claimed in claim 1, wherein the preferred thermal behavior is one that avoids accumulation of thermal effects in one or more of the components.

3. The method as claimed in claim 1, wherein the preferred thermal behavior is one that minimizes variation of thermal effects in one or more of the components.

4. The method as claimed in claim 1, wherein the determined sequence includes a conditioning lot in addition to the lots in the given collection.

5. The method as claimed in claim 1, wherein determining the sequence includes determining one or more lot sequencing rules for use in obtaining the preferred thermal behavior when processing a collection of future lots.

6. The method as claimed in claim 5, wherein the lot sequencing rules include one or more lots favoring one or more sub-sequences of layers, a sub-sequence comprising two or more particular layers in a particular order.

7. The method as claimed in claim 5, wherein determining the sequence includes identifying a plurality of sub-sequences that occur one or more times in the simulated different sequences of lots, and ranking each identified sub-sequence according to characteristics of thermal behavior associated with occurrences of the sub-sequence in the sequences of lots whose thermal behavior is simulated.

8. The method as claimed in claim 5, wherein determining the sequence further comprises using the lot sequencing rules when determining a sequence for processing a given collection of lots.

9. A control system for a lithographic apparatus, the control system comprising:
   storage arranged to receive information defining a collection of lots to be processed;
   storage arranged to receive a set of one or more lot sequencing rules obtained by the method as claimed in claim 5; and
   a controller configured to use the lot sequencing rules to determine a processing sequence for the defined collection of lots, and to control the lithographic apparatus to process the lots in the determined preferred sequence.

10. A lithographic apparatus including the control system as claimed in claim 9.

11. The method as claimed in claim 1, wherein in determining the sequence the given collection of lots is based on a collection of lots actually processed by the lithographic apparatus, and wherein the different sequences include one or more alternative sequences different than the one in which the real collection of lots was actually processed.

12. The method as claimed in claim 1, further comprising
   obtaining measurements of performance from a collection of lots actually processed in a real processing sequence;
   obtaining information of corrections applied in the patterning of the previously patterned lots; and
   calculating a prediction of performance measurements that would have been achieved, had the lots been processed using the determined sequence.

13. The method as claimed in claim 1, further comprising a controlling the lithographic apparatus to process a given collection of lots using the determined sequence.

14. A method of manufacturing devices wherein substrates are processed in a plurality of lots, the substrates within each lot receiving a particular layer pattern under layer-specific operating conditions while the substrates in other lots receive different layer patterns under different layer-specific operating conditions, thereby to define various layers of one or more products, wherein a collection of lots are processed in a sequence determined by the method as claimed in claim 1.

15. A non-transitory computer program product containing one or more sequences of machine-readable instructions, when executed by a computer system, configured to cause the computer system to at least:
   use a thermal model to simulate thermal behavior of one or more components within a lithographic apparatus configured to apply patterns to a number of product substrates to define various layers of one or more products, in response to layer-specific operating conditions associated with each lot when processing a given collection of lots in two or more different processing sequences; and
   based on comparison of the simulated thermal behavior in different sequences of lots, determine a sequence for processing a collection of lots for the lithographic apparatus to obtain a preferred thermal behavior.

16. The computer program product of claim 15, wherein the preferred thermal behavior is one that avoids accumulation of or minimizes variation of, thermal effects in one or more of the components.

17. The computer program product of claim 15, wherein the determined sequence includes a conditioning lot in addition to the lots in the given collection.

18. The computer program product of claim 15, wherein determination of the sequence includes determination of one or more lot sequencing rules for use in obtaining the preferred thermal behavior when processing a collection of future lots.

19. The computer program product of claim 15, wherein in determination of the sequence the given collection of lots is based on a collection of lots actually processed by the lithographic apparatus, and wherein the different sequences include one or more alternative sequences different than the one in which the real collection of lots was actually processed.

20. The computer program product of claim 15, wherein the instructions are further configured to control the lithographic apparatus to process a given collection of lots using the determined sequence.

* * * * *